United States Patent
Candelier et al.

(10) Patent No.: US 8,470,645 B2
(45) Date of Patent: Jun. 25, 2013

(54) METHOD FOR MANUFACTURING AN ANTIFUSE MEMORY CELL

(75) Inventors: Philippe Candelier, Saint Mury Monteymond (FR); Elise Le Roux, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 55 days.

(21) Appl. No.: 13/038,630

(22) Filed: Mar. 2, 2011

(65) Prior Publication Data

US 2011/0223723 A1 Sep. 15, 2011

(30) Foreign Application Priority Data

Mar. 11, 2010 (FR) ...................................... 10 51760

(51) Int. Cl.
*H01L 21/8246* (2006.01)
(52) U.S. Cl.
USPC ..... 438/131; 438/276; 438/289; 257/E21.662
(58) Field of Classification Search
USPC ........................... 438/131, 275, 276, 289, 601
See application file for complete search history.

(56) References Cited

U.S. PATENT DOCUMENTS

| | | | |
|---|---|---|---|
| 7,790,517 B2 * | 9/2010 | Manabe et al. | 438/131 |
| 8,045,414 B2 * | 10/2011 | Namekawa | 365/225.7 |
| 8,284,597 B2 * | 10/2012 | Chang et al. | 365/175 |
| 2006/0203591 A1 | 9/2006 | Lee | |
| 2008/0090363 A1 | 4/2008 | Manabe | |
| 2008/0316852 A1 | 12/2008 | Matsufuji | |
| 2012/0244671 A1 * | 9/2012 | Mitchell et al. | 438/239 |

FOREIGN PATENT DOCUMENTS

JP 2004111957 A 4/2004

* cited by examiner

*Primary Examiner* — Alexander Ghyka
(74) *Attorney, Agent, or Firm* — The Noblitt Group, PLLC

(57) ABSTRACT

A method for forming a memory cell including a selection transistor and an antifuse transistor, in a technological process adapted to the manufacturing of a first and of a second types of MOS transistors of different gate thicknesses, this method including the steps of: forming the selection transistor according to the steps of manufacturing of the N-channel transistor of the second type; and forming the antifuse transistor essentially according the steps of manufacturing of the N-channel transistor of the first type, by modifying the following step: instead of performing a P-type implantation in the channel region at the same time as in the N-channel transistors of the first type, performing an N-type implantation in the channel region at the same time as in the P-channel transistors of the first type.

7 Claims, 4 Drawing Sheets

METHOD FOR MANUFACTURING AN ANTIFUSE MEMORY CELL

BACKGROUND OF THE INVENTION

1. Field of the Invention

The present invention relates to a non-volatile anti-fuse memory cell. It more specifically relates to a method for forming such a memory cell.

2. Discussion of the Related Art

An antifuse is a one-time programmable element, in which a programmed state corresponds to a conductive state and an unprogrammed state corresponds to a non-conductive state. Antifuses formed of capacitors, in which the programming comprises the breakdown of the insulating layer of the capacitor, will here be considered. The forming of an antifuse memory cell in CMOS technology, where the capacitor actually is a MOS transistor and where the programming comprises breaking down the gate oxide of the MOS transistor, will more specifically be considered herein.

FIG. 1 is an equivalent electric diagram of an anti-fuse memory cell 10 in MOS technology. Memory cell 10 comprises a selection N-channel MOS transistor 11 and a recording N-channel MOS transistor 13, or antifuse transistor. Source $S_{13}$ of transistor 13 is connected to drain $D_{11}$ of transistor 11 and the bulk well of transistor 13 is grounded.

In a write operation, a relatively high write voltage $V_H$ is applied to gate $G_{13}$ of transistor 13 and a voltage $V_L$, which is small as compared with $V_H$, is applied to source $S_{11}$ of transistor 11. If transistor 11 is turned on by application of a selection voltage $V_{SEL}$ on its gate $G_{11}$, the gate oxide of transistor 13 breaks down. A permanent short-circuit then forms between gate $G_{13}$ and the bulk well of transistor 13. As an example, in a write operation, voltage $V_H$ may be on the order of 7 V and voltage $V_L$ may be set to 0 V. It should be noted that the gate oxide of selection transistor 11 will have to be substantially thicker than the gate oxide of transistor 13 to avoid for transistor 11 to be damaged in the write operation.

In a read operation, transistor 11 is turned on by application of a selection voltage $V_{SEL}$ on its gate $G_{11}$. A read voltage is applied to gate $G_{13}$ of transistor 13, and a voltage smaller than the read voltage is applied to source $S_{11}$ of transistor 11. The read operation comprises measuring the current flowing through transistor 11. If the gate oxide of transistor 13 has broken down, a current flows between gate $G_{13}$ of transistor 13 and source $S_{11}$ of transistor 11. Conversely, if the gate oxide of transistor 13 is intact, no current flows between gate $G_{13}$ of transistor 13 and source $S_{11}$ of transistor 11. As an example, in a read operation, the read voltage applied to gate $G_{13}$ may be on the order of 2.5 V and the voltage applied to source $S_{11}$ may be set to 0 V.

Standard cell libraries are generally used to ease the design and the synthesis of integrated circuits. Each cell corresponds to an elementary component, for example, a MOS transistor, or to a component assembly. During the synthesis of an integrated circuit, cells of the library are selected, arranged, and interconnected, to provide the required circuit functions.

To minimize costs, an antifuse memory cell of the type described in relation with FIG. 1 is generally formed, by using MOS transistors corresponding to standard library elements available in the considered technological manufacturing process.

Currently, in a given technology, there exist two types of standard N-channel MOS transistors (and their P-channel complementaries), respectively a transistor NMOSGO1 (and its complementary PMOSGO1), of minimum size, intended to implement logic functions of the integrated circuits, and a transistor NMOSGO2 (and its complementary PMOSGO2), having a greater gate oxide thickness than transistor NMOSGO1, intended to implement power functions of the integrated circuits (for example, output amplification functions). As an example, gate oxide thickness e1 of transistor NMOSGO1 may be on the order of from 1 to 3 nm, and gate oxide thickness e2 of transistor NMOSGO2 may be on the order of from 3 to 5 nm. For simplification, terms "gate oxide" will be used herein. It should however be noted that the insulating region between the gate and the well of the transistor is not necessarily made of silicon oxide. It may be made of other adapted materials with a high dielectric constant.

FIG. 2 is a cross-section view schematically showing an embodiment of memory cell 10 described in relation with FIG. 1. In this example, antifuse transistor 13 corresponds to a standard cell NMOSGO1 having a gate thickness e1 and selection transistor 11 corresponds to a standard cell NMOSGO2 having a gate thickness e2 greater than e1.

Transistor NMOSGO1 (on the right side of FIG. 2) is formed in a P-type doped well PWellGO1, itself formed in a semiconductor substrate, not shown. Transistor NMOSGO1 comprises a source region 18NGO1 ($S_{13}$) and a drain region 19NGO1 ($D_{13}$), of type N$^+$, located on either side of a gate 20NGO1 ($G_{13}$) insulated from the substrate by an insulating layer 21NGO1 of thickness e1. N-type regions 22NGO1, more lightly doped than regions 18NGO1 and 19NGO1, are formed on either side of the gate, in the upper portion of the well, under insulating spacers 24NGO1. In this example, P-type pockets 26NGO1, more heavily doped than well PWellGO1, are arranged partly around regions 22NGO1, to isolate the two regions 22NGO1 from each other. A P-type region 27NGO1, more heavily doped than well PWellGO1, is implanted under the gate, at the level of the channel region, to adjust the transistor threshold voltage. It should be noted that in practice, N-type source and drain regions 22NGO1 slightly juts out under the transistor gate.

Transistor NMOSGO2 (on the left side of FIG. 2) is formed in a P-type doped well PWellGO2 of different doping level than well PWellGO1. Transistor NMOSGO2 comprises N$^+$-type source and drain regions 18NGO2 ($S_{11}$) and 19NGO2 ($D_{11}$) (of same doping level as regions 18NGO1 and 19NGO1 in this example) located on either side of a gate 20NGO2 ($G_{11}$) insulated from the substrate by an insulating layer 21NGO2 of thickness e2. N-type regions 22NGO2, more lightly doped than regions 18NGO2 and 19NGO2, are formed on either side of the gate, in the upper portion of the well, under insulating spacers 24NGO2. A P-type region 27NGO2, more heavily doped than well PWellGO2, is implanted under the gate, at the level of the channel region, to adjust the threshold voltage of the transistor.

In this example, source region 18NGO1 of transistor NMOSGO1 and drain region 19NGO2 of transistor NMOSGO2 are common and no separation insulating region is provided between the two transistors. The source, drain, and gate regions are covered with a silicide contacting layer 28. Further, an insulating layer 29, for example comprising silicon oxide, covers the assembly formed by the two transistors. Vias 30, crossing layer 29, come into contact with silicide regions 28 and enable to form electric connections with the source, drain, and gate regions.

Memory cell 10 has the advantage of being compact and cheap to implement, since it is exclusively formed from standard elementary cells of the considered technological process. However, this memory element has several disadvantages. It especially comprises, side by side, transistors formed in wells of different dopings, which is a problem in terms of manufacturing and may degrade the performance of one of the transistors if the well of the other transistor juts out on its side. It can further be acknowledged that the on-state read current varies from one memory cell to another. It would be desirable to optimize the antifuse transistor to at least partly overcome some of the disadvantages of the above structure. However, creating a specific transistor for the antifuse transistor poses problems since an additional standard cell and additional manufacturing steps should normally be provided.

SUMMARY OF THE INVENTION

Thus, an aspect of an embodiment of the present invention provides a method for forming an optimized memory cell comprising no manufacturing steps other than the usual manufacturing steps of standard transistors of the considered technological process and using no additional masks.

An embodiment of the present invention provides a method for forming a memory cell comprising a selection MOS transistor and an antifuse MOS transistor, in a technological process adapted to the manufacturing of a first type of MOS transistors of a first gate thickness and of a second type of MOS transistors of a second gate thickness greater than the first thickness, this method comprising the steps of: forming the selection transistor according to the steps of manufacturing of the N-channel transistor of the second type; and forming the antifuse transistor essentially according the steps of manufacturing of the N-channel transistor of the first type, by modifying the following step: instead of performing a P-type implantation in the channel region at the same time as in the N-channel transistors of the first type, performing an N-type implantation in the channel region at the same time as in the P-channel transistors of the first type.

According to an embodiment of the present invention, the steps of manufacturing of the antifuse transistor further comprise the following modification: instead of forming the bulk well at the same time as in the N-channel transistors of the first type, forming the bulk well at the same time as in the N-channel transistors of the second type.

According to an embodiment of the present invention, the transistors of the first type are transistors of minimum dimensions of the technological process.

According to an embodiment of the present invention, the source and drain regions of the N-channel transistor of the first type comprise more lightly doped portions close to the gate.

According to an embodiment of the present invention, the steps of manufacturing of the antifuse transistor further comprise the following modification: instead of forming the more lightly-doped source and drain portions at the same time as in the N-channel transistors of the first type, forming the more lightly-doped source and drain portions at the same time as in the N-channel transistors of the second type.

According to an embodiment of the present invention, the N-channel transistors of the first type comprise insulating spacers on either side of the gate.

According to an embodiment of the present invention, the N-channel transistors of the first type comprise P-type pockets arranged on either side of the gate, around a portion of the source and drain regions, and the antifuse transistor does not comprise P-type pockets around the source and drain regions.

The foregoing objects, features, and advantages of the present invention will be discussed in detail in the following non-limiting description of specific embodiments in connection with the accompanying drawings.

DETAILED DESCRIPTION

Figure 1:
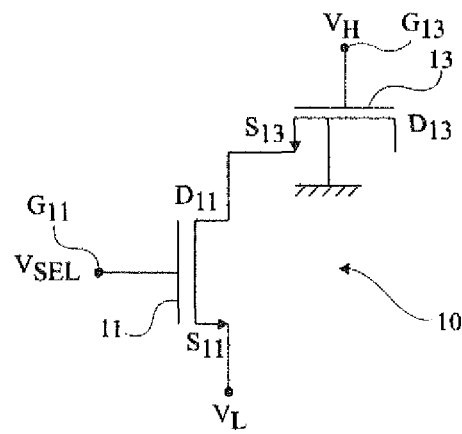
FIG. 1, previously described, is an equivalent electric diagram of an antifuse memory cell in MOS technology.

For clarity, the same elements have been designated with the same reference numerals in the different drawings and, further, as usual in the representation of integrated circuits, the various cross-section views are not drawn to scale.

Figure 2:
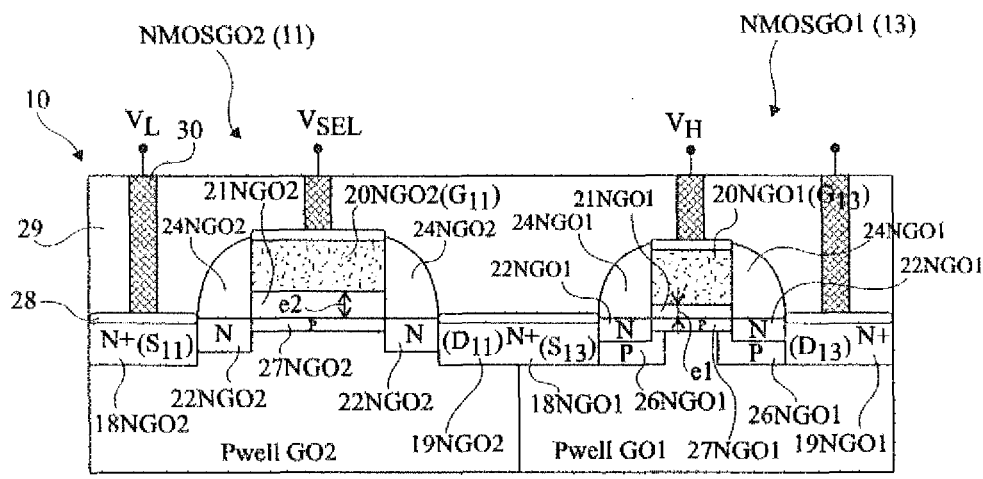
FIG. 2, previously described, is a cross-section view schematically showing an embodiment of the memory cell of FIG. 1, in a given manufacturing technological process.

The present inventors have studied the behavior of memory cell 10 described in relation with FIG. 2, and especially the phenomena resulting in the dispersion of read currents from one memory cell to another. The short-circuit formed through gate oxide 21NGO1 of the antifuse transistor, after a write operation, generally is a spot short-circuit, or a short-circuit having much smaller dimensions (in top view) than the gate oxide dimensions. This short-circuit may occur in any position of gate oxide 21NGO1. In particular, the short-circuit may occur either above the P-type channel region, or above the N-type source region, at the level where the source region extends under gate 20NGO1. If the short-circuit is located at the level of the transistor channel region, in a read operation, a voltage drop occurs, especially due to the PN junction between the channel region (P) and the source region (N). This results in a decrease in the memory cell read current. However, if the short-circuit is located directly at the level of the transistor source region, this voltage drop does not appear and the read current is all the greater. A dispersion of read currents from one memory cell to another can thus be observed.

The present description relates to an antifuse memory cell where the channel region of the antifuse transistor is less resistive than in standard transistor NMOSGO1. It especially provides a memory cell in which, in read operations, no voltage drop due to transistor junctions occurs, and this whatever the position of the short-circuit in the antifuse transistor oxide. The antifuse transistor and the selection transistor are formed in wells of same doping level. The method for forming such a memory cell comprises no other manufacturing steps than the usual standard transistor manufacturing steps of the considered technological process.

Generally, a memory cell in which the selection transistor is manufactured according to steps of manufacturing of a standard transistor NMOSGO2 is described herein, and the anti-fuse transistor is essentially manufactured according to the steps of manufacturing a standard transistor NMOSGO1, only some of the used masks being modified to optimize the antifuse transistor by using methods for manufacturing other standard transistors of the technology.

FIGS. 3A to 3I are cross-section views schematically showing steps of manufacturing of various standard transistors of a given technological process, and of an antifuse transistor. In FIGS. 3A to 3I, the first, second, third, and fourth columns starting from the left respectively show steps of the manufacturing of standard N-channel transistor NMOSGO1, of its P-channel complementary PMOSGO1, of standard N-channel transistor NMOSGO2, and of a non-standard transistor NMOSANTIFUS, capable of being used as an antifuse transistor in a memory cell.

Figure 3A:
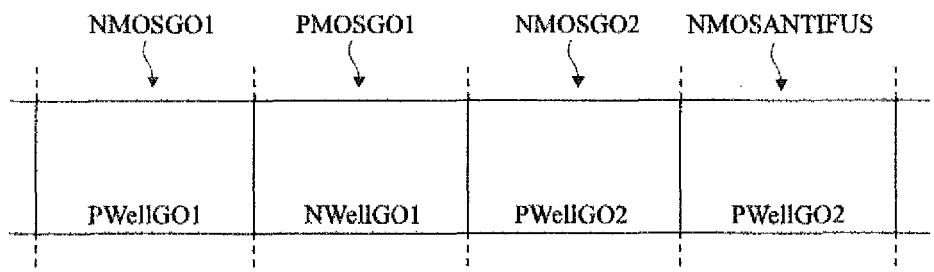
FIGS. 3A to 3I are cross-section views schematically showing steps of the manufacturing of various standard transistors of a given technological process, and of an antifuse transistor according to an embodiment of the present invention.

As illustrated in FIG. 3A, the forming of standard transistors NMOSGO1, PMOSGO1, and NMOSGO2 comprises a step of forming of wells, respectively P-type well PWellGO1 of a first doping level, N-type well NWellGO1, and P-type well PWellGO2 of a second doping level. The forming of transistor NMOSANTIFUS comprises a step of forming of a well PWellGO2, identical to the step of forming of the well of transistor NMOSGO2. In other words, at the time when wells PWellGO1 are formed, instead of being open like for transistors NMOSGO1, the mask defining the well of transistor NMOSANTIFUS is closed. Conversely, at the time when wells PWellGO2 are formed, the mask defining the well of transistor NMOSANTIFUS is open.

In the drawings, the wells of transistors NMOSGO1, PMOSGO1, NMOSGO2, and NMOSANTIFUS have been shown juxtaposed two by two. It may of course be chosen to provide or not an insulating separation between the transistors. This separation may be formed by trenches filled with an insulator such as silicon oxide. Such an insulation however has the disadvantage of increasing the bulk of the structure.

Figure 3B:
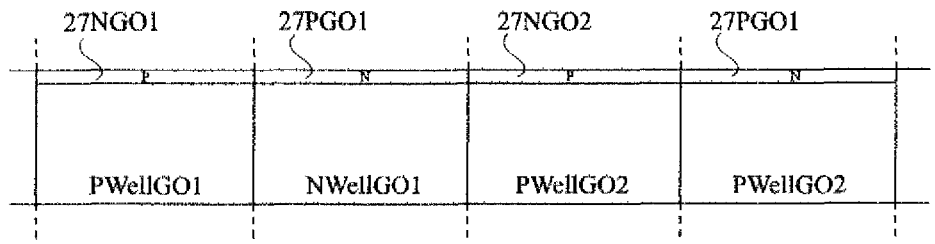

As illustrated in FIG. 3B, the forming of standard transistors NMOSGO1, PMOSGO1, and NMOSGO2 comprises a step of forming, by implantation of dopants at the well surface, of a region (respectively 27NGO1, 27PGO1, 27NGO2) of same conductivity type as the well but of a greater doping level. This implantation especially enables to adjust the threshold voltage of the transistors. Instead of a P-type surface implantation as for transistors NMOSGO1, the forming of transistor NMOSANTIFUS comprises a step of surface implantation of an N-type region 27PGO1, at the same time as the step of surface implantation of transistors PMOSGO1. If the considered technology enables to select from among several doping levels for the N-type surface implantation of transistor PMOSGO1, the highest doping level will preferably be selected for transistor NMOSANTIFUS.

Figure 3C:
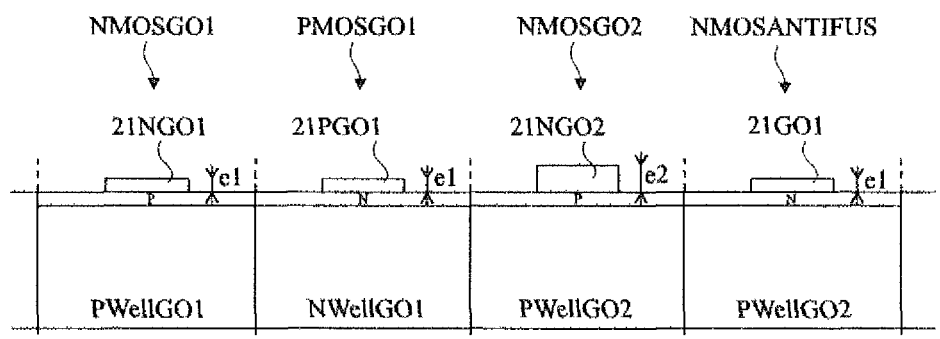

FIG. 3C illustrates, for standard transistors NMOSGO1, PMOSGO1, and NMOSGO2, a step of forming of a gate oxide above the well. For transistors NMOSGO1 and PMOSGO1, a gate oxide of thickness e1 (respectively 21NGO1, 21PGO1) is formed at the well surface. For transistor NMOSGO2, a gate oxide 21NGO2, of thickness e2 greater than e1, is formed at the well surface. The forming of transistor NMOSANTIFUS comprises a step of forming of a gate oxide 21GO1 of thickness e1, identical to the step of forming of the gate oxide of one of standard transistors NMOSGO1 or PMOSGO1.

Figure 3D:
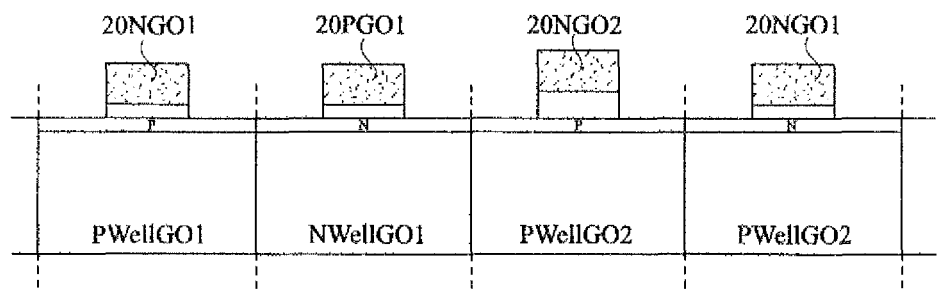

FIG. 3D illustrates, for standard transistors NMOSGO1, PMOSGO1, and NMOSGO2, a step of forming of a conductive gate (respectively 20NGO1, 20PGO1, 20NGO2) above the gate oxide. The gate is for example formed of a doped polysilicon layer (of type N for N-channel transistors NMOSGO1 and NMOSGO2 and of type P for P-channel transistor PMOSGO1). The forming of transistor NMOSANTIFUS comprises a step of forming of a conductive gate 20NGO1, identical to the step of forming of the gate of standard N-channel transistor NMOSGO1.

Figure 3E:
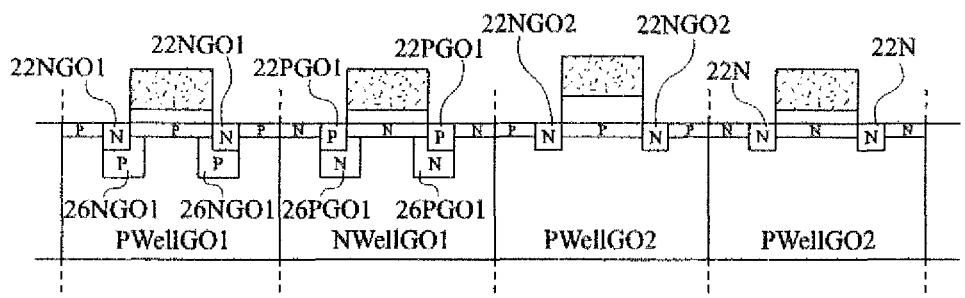

As illustrated in FIG. 3E, the forming of standard transistors NMOSGO1, PMOSGO1, and NMOSGO2 comprises a step of forming of lightly-doped (LDD) source and drain portions (respectively N-type 22NGO1, P-type 22PGO1, and N-type 22NGO2), arranged on either side of the gate.

Further, the forming of standard transistors of minimum dimensions NMOSGO1 and PMOSGO1 comprises a step of forming, under and around regions 22NGO1 and 22PGO1, of pockets, respectively of type P, 26NGO1, more heavily doped than well PWellGO1, and of type N, 26PGO1, more heavily doped than well NWellGO1.

The forming of transistor NMOSANTIFUS comprises a step of forming of lightly doped N-type source and drain portions 22N, identical to the step of forming of the source and drain portions of standard N-channel transistors NMOSGO1 or NMOSGO2. Further, in the forming of transistor NMOSANTIFUS, it is preferably provided to avoid forming P-type pockets under regions 22N.

It should be noted that P-type pockets, when present, are formed by using the same mask as the mask for forming regions 22. To form transistor NMOSANTIFUS, either a step of forming of source and drain portions 22N identical to the step of forming of the source and drain portions of transistor NMOSGO2 (which comprises no pocket), or a step identical to the step of forming of the source and drain portions of transistor NMOSGO1 will be used, by orienting the structure, by rotation, with respect to the implantation orientations to avoid forming pockets in this transistor.

Figure 3F:
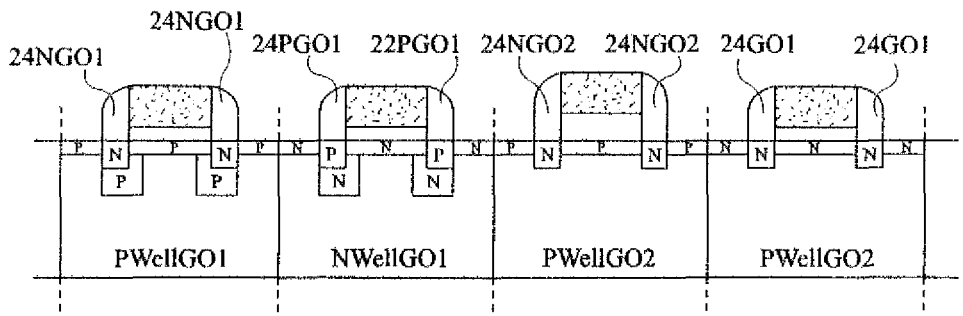

FIG. 3F illustrates, for transistors NMOSGO1, PMOSGO1, and NMOSGO2, a step of forming of insulating spacers (respectively 24NGO1, 24PGO1, 24NGO2) on either side of the gate, above lightly-doped source and drain portions 22. The forming of transistor NMOSANTIFUS comprises a step of forming of insulating spacers 24GO1, identical to the step of forming of the spacers of standard transistors of minimum dimensions NMOSGO1 and PMOSGO1.

Figure 3G:
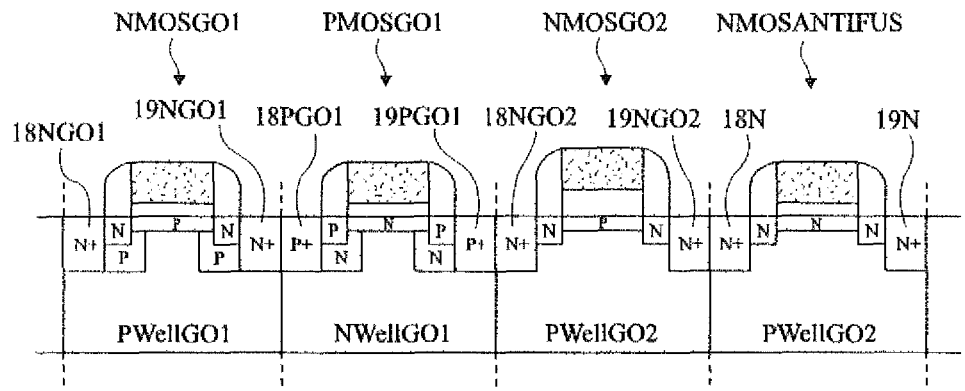

As illustrated in FIG. 3G, the forming of transistors NMOSGO1, PMOSGO1, and NMOSGO2 comprises a step of forming of the source regions (respectively 18NGO1, 18PGO1, 18NGO2) and of the drain regions (respectively 19NGO1, 19PGO1, 19NGO2). It should be noted that regions 18NGO1, 18NGO2, 19GO1, and 19NGO2 generally have the same doping level ($N^+$) and are formed simultaneously by means of the same mask. The forming of transistor NMOSANTIFUS comprises a step of forming of source and drain regions 18N and 19N, identical to the step of forming of the source and drain regions of standard N-channel transistors NMOSGO1 and NMOSGO2.

Figure 3H:
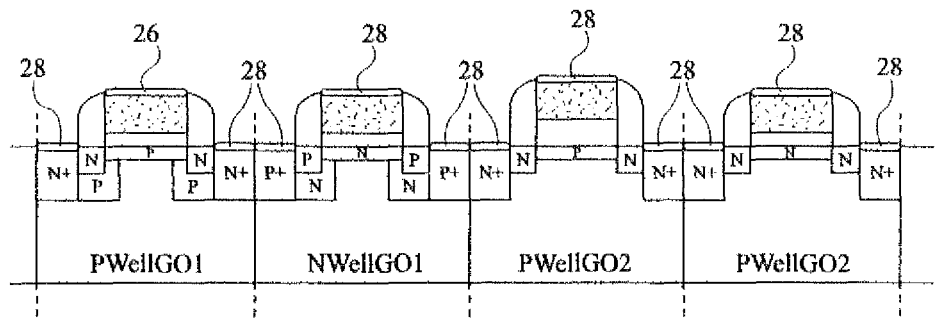

FIG. 3H illustrates a step of forming of a silicide contact layer on the gate, source and drain regions NMOSGO1, PMOSGO1, NMOSGO2, and NMOSANTIFUS.

Figure 3I:
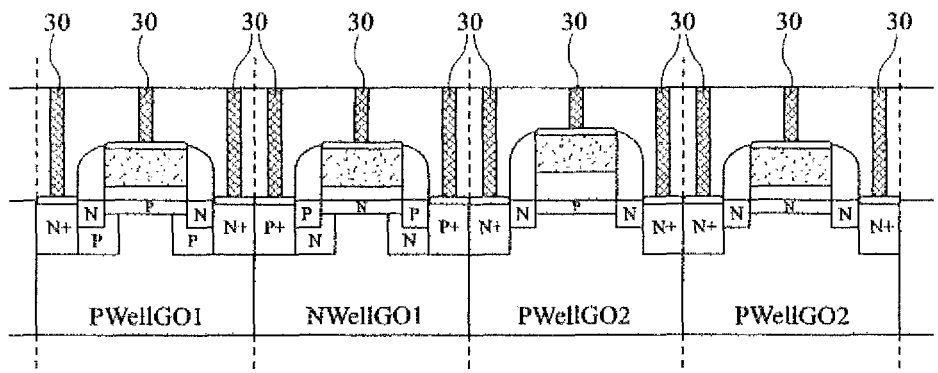

In a final manufacturing step, illustrated in FIG. 3I, transistors NMOSGO1, PMOSGO1, NMOSGO2 and NMOSANTIFUS are covered with an insulating layer 29, for example, made of silicon oxide. Vias 30, crossing insulating layer 29 and coming into contact with silicide regions 28, may be formed to create electric connections with the source, drain, and gate regions of the transistors.

It should be noted that the step, described in relation with FIG. 3B, of adjustment implantation in the channel region of the transistor, is not necessarily carried out immediately after the forming of the transistor well. As an example, this step may be implemented after the forming of the transistor gate. An oblique implantation (from the sides) will then be used, which enables to reach the channel region despite the presence of the gate.

Figure 4:
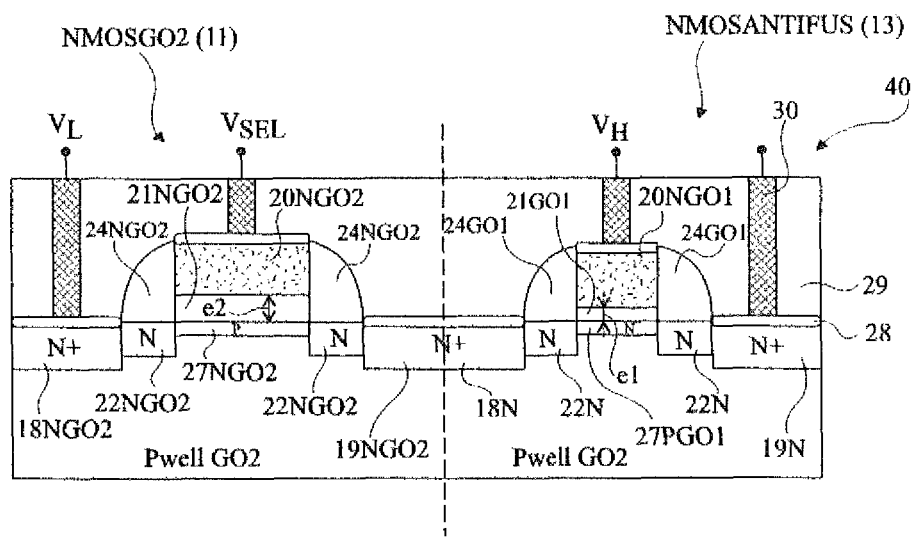
FIG. 4 is a cross-section view schematically showing an antifuse memory cell formed according to the method described in relation with FIGS. 3A to 3I.

FIG. 4 is a cross-section view schematically showing an embodiment of an antifuse memory cell 40 of the type described in relation with FIG. 1. In memory cell 40, selection transistor 11 corresponds to a standard transistor NMOSGO2, and antifuse transistor 13 corresponds to a transistor NMOSANTIFUS formed according to the method described in relation with FIGS. 3A to 3I.

In the memory cell 40 of FIG. 4, the channel region of antifuse transistor NMOSANTIFUS is of type N, and therefore there is no more junction capable of decreasing the read current, regardless of the position of the short-circuit in the gate oxide of the transistor. Further, the channel of antifuse transistor NMOSANTIFUS is less resistive than the channel of a standard transistor NMOSGO1. This is especially due to the selection of a high N-type doping level in the channel region of this transistor. Further, conversely to transistor NMOSGO1, transistor NMOSANTIFUS comprises no P-type pockets under and around source and drain portions 22N. This improves the electric conductivity of the channel region of the antifuse transistor. Thus, such a memory cell structure enables the suppression of or significant decrease in the dispersion of read currents with respect to structures in which the antifuse transistor directly corresponds to a standard transistor (NMOSGO1) of the considered technology. Such a structure further enables for the read currents to be higher than in usual solutions. Indeed, for identical read voltages, in a memory cell 40 (FIG. 4), the read current is always approximately identical to the read current of a memory cell 10 (FIG. 2) in which the short-circuit would directly occur at the level of the source region of the antifuse transistor. This provides a better differentiation between programmed memory cells and unprogrammed memory cells.

More generally, to form antifuse transistor NMOSANTI-FUS, manufacturing steps are selected (by playing on the opening and the closing of the masks) from among standard transistor manufacturing steps of the technology, to minimize as much as possible P-type implantations in the channel region, and to replace them if need be with N-type implantations.

According to another advantage of memory cell 40 of FIG. 4, the write voltage is capable of being decreased with respect to memory cell 10 of FIG. 2. Further, for a given write voltage, structure 40 (in the programmed state) has a better electric conductivity in the antifuse transistor than structure 10.

More generally, according to an advantage of the provided structure, for identical write voltages, the programming of memory cell 40 of FIG. 4 is much faster than the programming of memory cell 10 of FIG. 2. With the provided structure, the present inventors have especially measured a decrease by a factor of forty of the memory cell programming speed.

According to another advantage of memory cell 40 of FIG. 4, selection transistor 11 and antifuse transistor 13 are formed in wells PWellGO2 of same doping level. Thus, the performance of selection transistor 11 does not risk being degraded by a possible jutting out of the well of antifuse transistor 13. This enables to improve the read and write performance of the memory cells.

According to an advantage of memory cell 40, the corresponding embodiment only comprises steps selected from among the steps of formation of standard transistors of the considered technology. Further, to obtain the desired result, the number of mask modifications with respect to a standard transistor NMOSGO1 is very limited (on the order of from two to four masks in the above example).

Specific embodiments of the present invention have been described. Different variations and modifications will occur to those skilled in the art.

In particular, a method for forming an antifuse memory cell has been described hereabove, this method only comprising steps selected from among the steps of forming of three standard MOS transistors of a given technology (NMOSGO1, PMOSGO1, and NMOSGO2). The present invention is not limited to this specific case. It will be within the abilities of those skilled in the art to implement the desired operation by using steps selected from among the steps of forming of other standard elementary cells of the considered technology.

Further, it will be within the abilities of those skilled in the art to implement the desired operation in the case where standard transistors of the technology would have different topologies than those described hereabove.

Of course, the present invention is likely to have various alterations, modifications, and improvements, which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a memory cell comprising a selection MOS transistor (11) and an antifuse MOS transistor, from standard elementary cells of a technological process, these cells corresponding respectively to a first type of MOS transistors (NMOSGO1, PMOSGO1) of a first gate thickness (e1), adapted to implement logic functions of integrated circuits, and to a second type of MOS transistors (NMOSGO2) of a second gate thickness (e2) greater than the first thickness, adapted to implement power functions of integrated circuits, this method comprising the steps of:
   forming the selection transistor according to the steps of manufacturing of an N-channel transistor of the second type (NMOSGO2); and
   forming the antifuse transistor essentially according to the steps of manufacturing an N-channel transistor of the first type (NMOSGO1), by modifying the following step: instead of performing a P-type implantation in the channel region at the same time as in the N-channel transistors of the first type (NMOSGO1), performing an N-type implantation in the channel region (27PGO1) at the same time as in the P-channel transistors of the first type (PMOSGO1), wherein the antifuse transistor comprises the modified channel region of opposite implantation type to the channel region of the N-channel transistor of the first type (NMOSGO1).

2. The method of claim 1, wherein the steps of manufacturing of the antifuse transistor (13) further comprise the following modification: instead of forming the bulk well at the same time as in the N-channel transistors of the first type (NMOSGO1), forming the bulk well (PWellGO2) at the same time as in the N-channel transistors of the second type (NMOSGO2).

3. The method of claim 1, wherein the transistors of the first type (NMOSGO1, PMOSGO1) are transistors of minimum dimensions of the technological process.

4. The method of claim 1, wherein the source (18NGO1) and drain (19NGO1) regions of the N-channel transistor of the first type (NMOSGO1) comprise more lightly doped portions (22NGO1) close to the gate.

5. The method of claim 4, wherein the steps of manufacturing of the antifuse transistor (13) further comprise the following modification: instead of forming the more lightly-doped source and drain portions at the same time as in the N-channel transistors of the first type (NMOSGO1), forming the more lightly-doped source and drain portions (22N) at the same time as in the N-channel transistors of the second type (NMOSGO2).

6. The method of claim 1, wherein the N-channel transistors of the first type (NMOSGO1) comprise insulating spacers (24GO1) on either side of the gate.

7. The method of claim 1, wherein the N-channel transistors of the first type (NMOSGO1) comprise P-type pockets (26NGO1) arranged on either side of the gate, around a portion of the source and drain regions, and wherein the antifuse transistor (13) does not comprise P-type pockets around the source and drain regions.

* * * * *